United States Patent [19]

Szarvas

[11] 4,250,470
[45] Feb. 10, 1981

[54] SYLLABIC COMPANDER WITH LOGARITHMIC CHAIN

[75] Inventor: George G. Szarvas, Bethesda, Md.

[73] Assignee: Communications Satellite Corporation, Washington, D.C.

[21] Appl. No.: 919,655

[22] Filed: Jun. 28, 1978

[51] Int. Cl.³ .............................................. H04B 1/64
[52] U.S. Cl. ......................................... 333/14; 455/72
[58] Field of Search ............ 179/1 P, 15 AV; 325/62; 333/14

[56] References Cited

FOREIGN PATENT DOCUMENTS 1243974  8/1971  United Kingdom ...................... 333/14

Primary Examiner—Paul L. Gensler
Attorney, Agent, or Firm—Sughrue, Rothwell, Mion, Zinn and Macpeak

[57] ABSTRACT

A syllabic compander uses logarithmic chains in both the compressor and expander. The logarithmic chains are each constructed of a logarithmic amplifier, a scaler, and an antilogarithmic amplifier or their equivalents. The output of a logarithmic chain is equal to the input raised to a power determined by the scale factor of the scaler. A logarithmic chain is used with a multiplier and an average value circuit to implement equations of the form $$u_o = K u_i \bar{\bar{U}}^a$$

where $u_i$ is the input to the compressor or expander, $u_o$ is the output of the compressor or expander, $\bar{U}$ is the rms (or pseudo-rms) value of $u_i$ or $u_o$ averaged over the time of one syllable, $K$ is a constant, and $a$ is the scale factor which is a function of the compression or expansion rate. Since the scale factor $a$ may be easily adjusted, the compander permits flexibility in changing the compression and expansion rates.

2 Claims, 8 Drawing Figures

SYLLABIC COMPANDER WITH LOGARITHMIC CHAIN

BACKGROUND OF THE INVENTION

The present invention generally relates to speech transmission systems, and more particularly to a compander using a logarithmic chain that permits flexibility in changing the compression and expansion characteristics.

In the transmission of speech, amplitude compression at the transmitting end with subsequent expansion at the receiving end is called companding, i.e., compressing-expanding. Companding can be performed on the analog signal before linear coding or with a nonlinear encoder. An example of the latter is described in *Transmission Systems for Communications* writted by Members of the Technical Staff of Bell Telephone Laboratories and published by Bell Telephone Laboratories, fourth revised edition, in 1971 at pages 574 to 583. Of course, the transmitted and received signals are not always coded, and in the simplest form of this technique, the amplitude compressed analog signal is transmitted and received.

In existing companders, the compression and expansion law is rigidly "built into" the compressor and expander. The compression or expansion characteristics can be determined by a variable-loss device. Examples of this approach are described by R. O. Carter, "Theory of Syllabic Companders," *Proc. IEE*, Vol. 111, No. 3, March 1964, pages 503 to 513, and D. Thomson, "A Speech Compander Using Junction Transistors," *Post Office Elect. Engrs'.*, 1962, pages 14 to 18. In another approach, the compression and expansion characteristics can be determined by a fixed circuit configuration as described by H. G. Vandemark, "A Single-Channel-Per-Carrier Terminal for Satellite Communications," California Microwave Co. Publication, Dec. 13, 1974, pages 8 to 10.

The principle reason for using companders in the transmission of speech is to improve the signal-to-noise ratio. Some factors contributing to the signal-to-noise ratio improvement are as follows. In the no speech periods, the expander attenuates the line noise (including cross-talk) picked up between the compressor and expander. The speech following silent periods is made more intelligible due to the listener's adaptation to the lower background noise. Moreover, the means speech power is increased in the channel compared to the uncompanded level. This is discussed in some detail by Eitel M. Rizzoni, "Compander Loading and Noise Improvement in Frequency Division Multiplex Radio-Relay Systems," *Proc. IRE*, February 1960, pages 208 to 220.

As described by D. G. Pape, "Modulation and Speech Processing Techniques for a Maritime-Satellite Service," IEEE Satellite Systems for Mobile Comm. and Surveillance, Conf. Publ. No. 95, 13–15 March 1973, pages 56 to 61, the British Post Office uses for the overall subjective audio SNR, $(S_A/N)_S$, the following empirical formula:

$$(S_A/N)_S = S_A/N + 5/6 U - \tfrac{2}{3} N - 1/6 S$$

where
- $S_A/N$ = unweighted mean audio signal-to-noise ratio (dB)
- $U$ = unaffected level (dBmO)
- $S$ = mean signal level (dBmO) during speech
- $N$ = mean noise level (dBmO)

In the compander action, the compressor on the transmitter side compresses the volume range of syllables with the constant ratio of $\alpha$ in dB with respect to the unaffected level. At the receiving side the volume range of syllables is expanded with the ratio of $\beta$. The International Telegraph and Telephone Consultative Committee (CCITT) in the *Blue Book*, Vol. 3, Third Plenary Assembly (Geneva: May 25 to June 26, 1964), Recommendation G-162, page 62, recommends 0 dBmO for the unaffected level and $\alpha = \beta = 2$. More specifically, Recommendation G-162 defines the compressor and expander characteristics for a telephony compander as follows:

$$\text{Compressor: } \alpha = \frac{n_e - n_{eo}}{n_s - n_{so}} \tag{1a}$$

$$\text{Expander: } \beta = \frac{n_s' - n_{so}'}{n_e' - n_{eo}'} \tag{1b}$$

where
- $n_e$ and $n_e'$ = input levels
- $n_s$ and $n_s'$ = output levels
- $n_{eo}$ and $n_{eo}'$ = input levels (corresponding to 0 dBmO)
- $n_{so}$ and $n_{so}'$ = output levels corresponding to input levels $n_{eo}$ and $n_{eo}'$, respectively.

By expressing $n_s$ and introducing voltage $u_o$ associated with levels $n_s$ and similarly voltage $u_i$ associated with input level $n_e$, the preceding compression formula yields, $$u_o = K_1 u_i^{1/\alpha} = K_1 u_i \overline{U}_i^{(\frac{1-\alpha}{\alpha})} \tag{2a}$$

for compression and similarly $$u_o = K_2 u^\beta = K_2 u_i \overline{U}_i^{(\beta - 1)} \tag{2b}$$

expansion, where $U_i$ is the rms (or pseudo-rms) value of $u_i$ averaged over the time of one syllable, $K_1 = u_{io}^{(\alpha - 1/\alpha)}$, $K_2 = u_{io}^{1-\beta}$, and $u_{io}$ denotes the "unaffected voltage level," which remains unchanged at the compression and at the expansion. With the unaffected level chosen as 0 dBm (0.775 V), Table 1 gives the numerical values for $K_1$ and $K_2$.

TABLE 1

| $\alpha = \beta$ | 2 | 3 | 4 |
|---|---|---|---|
| $K_1$ | 0.88 | 0.84 | 0.83 |
| $K_2$ | 1.29 | 1.6 | 2.15 |

The following are equivalent to equations (2a) and (2b):

$$\text{Compression: } u_o = K_3 u_i \overline{U}_o^{(1-\alpha)} \tag{3a}$$

$$\text{Expansion: } u_o = K_4 u_i \overline{U}_o^{(\beta - 1/\beta)} \tag{3b}$$

where $$K_3 = K_1^\alpha \text{ and } K_4 = K_2^{2-\beta}.$$

SUMMARY OF THE INVENTION

The invention implements equations (2a), (2b) and/or (3a), (3b) by raising signals to a power, which is a function of compression and expansion rate, with a logarithmic amplifier, scaler, and anti-logarithmic amplifier. Equations (2a) and (2b) result in a feed forward configuration and equations (3a) and (3b) result in a feedback configuration. Both the compressor and expander can be implemented in the feedforward configuration or the feedback configuration. An alternative solution is to implement the compressor in feedback configuration, equation (3a), and the expander in feedforward configuration, equation (2b). This arrangement has advantages which will become apparent in the detailed description of the invention.

No matter what the configuration, both the compressors and expanders according to the invention are characterized by a logarithmic chain comprising a logarithmic amplifier, a scaler, and an anti-logarithmic amplifier or the equivalents thereof. This logarithmic chain is preceded by an averaging circuit which produces an rms (or pseudo-rms) value of $u_i$ or $u_o$. Thus, the output of the logarithmic chain is $\overline{U}_i$ or $\overline{U}_o$ raised to a power determined by the scale factor of the scaler. This has particular advantages since the power may now be varied and is no longer "built into" the circuitry. As a result, a study of subjective signal-to-noise improvement as a function of compression and expansion rates can be mad by manually adjusting the scale factor of the scalers in the compressor and expander logarithmic chains. It is also possible to provide for automatic adjustment of compression and expansion rates to provide level dependent compression and expansion and/or adaptive companding in multi-channel systems.

The output of the anti-logarithmic amplifier of the logarithmic chain is applied as one input to a multiplier to produce $u_o$. In the feedforward configuration, the input signal $u_i$ is applied after averaging to the input of the logarithmic chain and as the second input to the multiplier. In the feedback configuration, the output signal $u_o$ from the multiplier is applied after averaging as the input of the logarithmic chain, and the input signal $u_i$ is applied as the second input to the multiplier.

BRIEF DESCRIPTION OF THE DRAWINGS

The invention will be better understood from the following detailed description with reference to the accompanying drawings, in which.

DETAILED DESCRIPTION OF THE INVENTION

Figure 1:
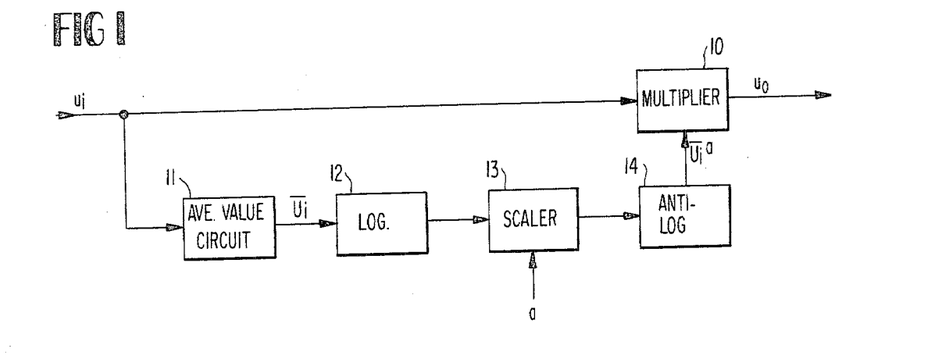
FIG. 1 is a block diagram of the basic feedforward compander according to the invention.

Referring now to the drawings wherein like reference numerals designate identical or corresponding parts throughout, the block diagram of FIG. 1 represents either the compressor or the expander of the feedforward compander. In other words, this circuit implements either equation (2a) or equation (2b) depending on the constant of proportionality and the scale factor. In this feedforward configuration, the input signal $u_i$ is applied as one input to the multiplier 10 and also as the input to the average value circuit 11. The output of the average value circuit 11 is the rms (or pseudo-rms) value of the input signal $u_i$ averaged over the time of one syllable. Average value circuits are, of course, well known to those of ordinary skill in the art and are readily implemented using rectifiers and RC time constant circuits. The output $\overline{U}_i$ of the average value circuit 11 is applied to the input of a logarithmic amplifier 12. The input to the scaler 13 is, therefore, a signal which is proportional to the logarithm of $\overline{U}_i$. The scaler 13 may be considered to be a type of multiplier which multiplies the input signal by a scale factor a. A potentiometer will perform such a scale factor multiplication, or a variable gain amplifier may be used. The output of the scaler 13 is connected to the input of an anti-logarithmic amplifier 14. Since the average value $\overline{U}_i$ has been first converted to a logarithm which was multiplied by a scale factor a and the result converted to an anti-logarithm, those skilled in the art will understand that the output of the anti-logarithmic amplifier 14 is a signal proportional to $\overline{U}_i{}^a$. The output of the anti-logarithmic amplifier 14 is applied as the other input to multiplier 10. Multiplier 10 therefore provides an output signal which is proportional to the product of the input signal $u_i$ and the output of the anti-logarithmic amplifier 14 $\overline{U}_i{}^a$ which will be recognized as the output signal $u_o$ in either of equations (2a) or (2b).

Referring now more specifically to equation (2a), the exponent of $\overline{U}_i$ is equal to $1-\alpha/\alpha$. Thus, when the circuit shown in FIG. 1 is used as a compressor, the scale factor a must be equal to $1-\alpha/\alpha$. From equation (2b), the exponent of $\overline{U}_i$ is equal to $\beta-1$. Thus, the same circuit shown in FIG. 1 is used as an expander by making the scale factor a equal to $\beta-1$. The constants of proportionality $K_1$ and $K_2$ can be determined by the multiplier 10.

Figure 2:
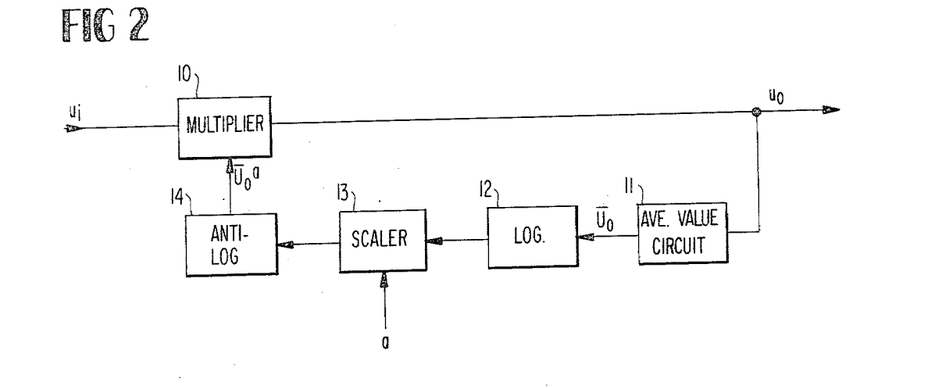
FIG. 2 is a block diagram of the basic feedback compander according to the invention.

In the feedback configuration shown in FIG. 2, the input signal $u_i$ is applied to one input of the multiplier 10 as before. However, in this configuration, the input to the average value circuit 11 is the output $u_o$ of the multiplier 10. Thus, the output of the average value circuit is $\overline{U}_o$ which is the rms (or pseudo-rms) value of $u_o$ averaged over the time of one syllable. The average value signal $\overline{U}_o$ is applied to the input of the logarithmic amplifier 12. As a result, the output of anti-logarithmic amplifier 14 is $\overline{U}_o{}^a$ which is applied as the other input to the multiplier 10. The output of multiplier 10 is, therefore, proportional to the product of $u_i$ and $\overline{U}_o{}^a$. With reference to equations (3a) and (3b), it will be observed that this is the required output signal $u_o$. To be used as a compressor, the scale factor a must be equal to $1-\alpha$, and to be used as an expander, the scale factor a should be equal to $\beta-1/\beta$. Again, the constants of proportionality $K_3$ and $K_4$ can be implemented in the multiplier 10.

For reasons of simplicity, implementation of both the compressor and expander in the feedforward configuration may be preferred. An alternative and attractive implementation consists of a compressor in the feedback configuration and an expander in the feedforward configuration. In this case, both detectors are working over the compressed dynamics range and the logarithmic chains are also identical. Obviously, it is also possible to implement a compressor in the feedforward configuration in combination with an expander implemented in the feedback configuration.

Figure 3:
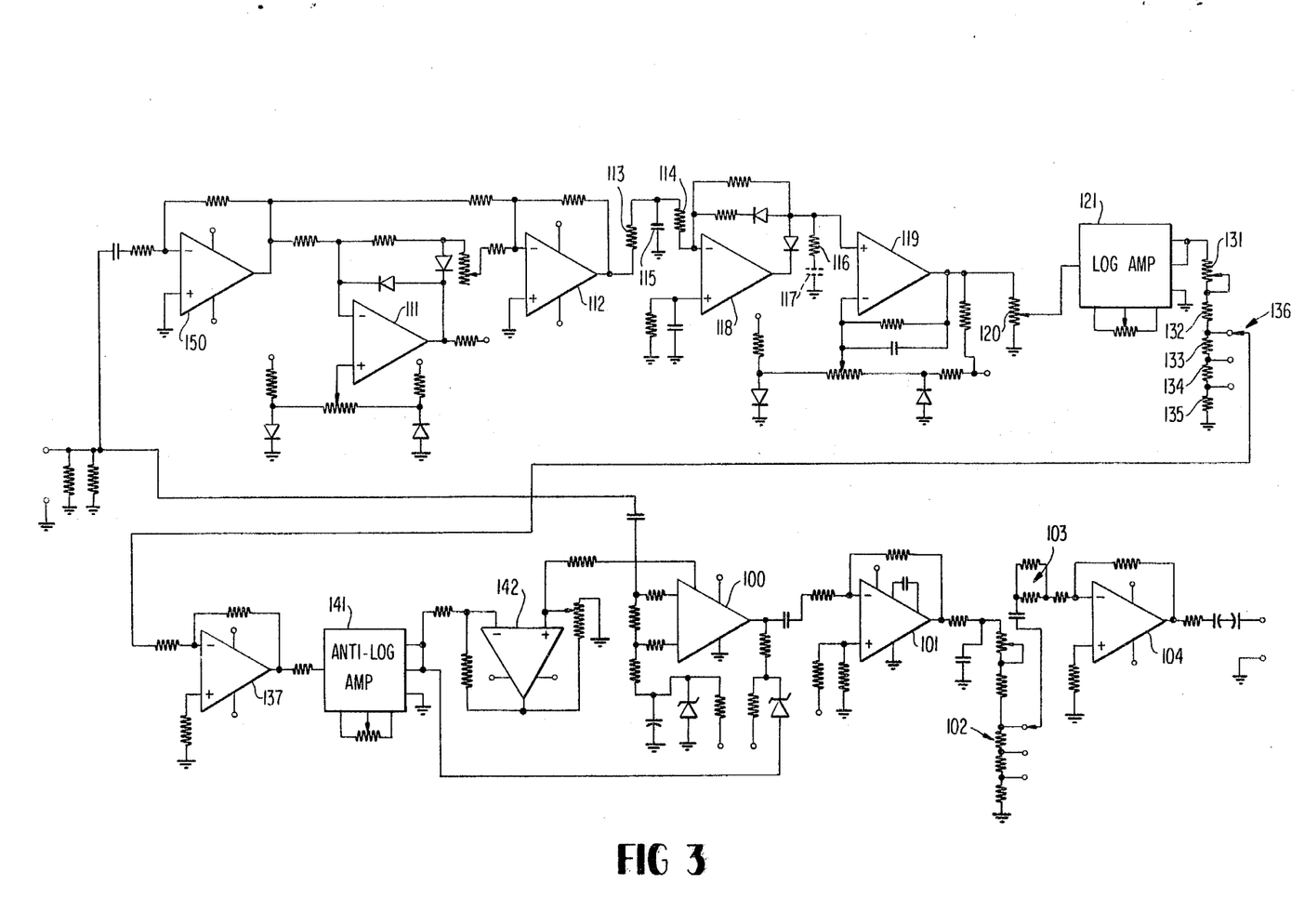
FIG. 3 is a schematic diagram showing one specific embodiment of the compressor stage of the feedforward compander.
Figure 4:
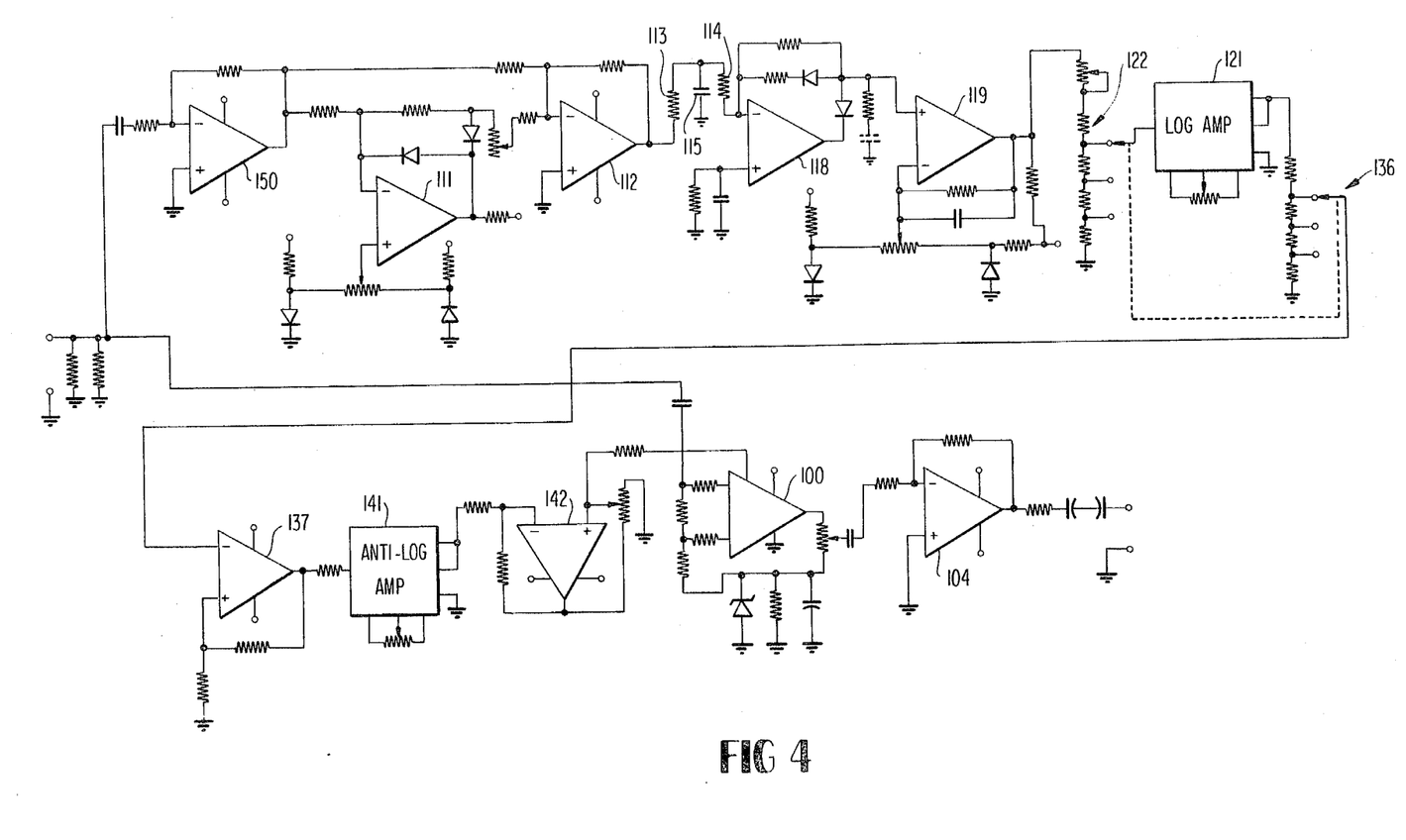
FIG. 4 is a schematic diagram showing one specific embodiment of the expander stage of the feedforward compander.

Implementation of both the compressor and the expander in the feedforward configuration is illustrated in FIGS. 3 and 4. FIG. 3 illustrates a detailed schematic diagram of a compressor stage using commerically available integrated circuits. Amplifier 150 is an AC amplifier connected to receive the input signal $u_i$. Amplifier 150 may be one-half of a μA747 integrated circuit amplifier manufactured by Fairchild Semiconductor. The next two amplifiers 111 and 112 and their related circuitry constitute a precision 2-way rectifier. The amplifiers 111 and 112 may each be one-fourth of a type LM324 integrated circuit amplifier manufactured by Intersil, Inc. The resistors 113 and 114 in combination with the capacitor 115 at the output of the precision 2-way rectifier define an attack time constant of 3 ms. If a recovery time constant greater than the attack time constant must be used, it will be defined by resistor 116 and capacitor 117 at the output of amplifier 118 which receives as its input and output of the attack time constant circuit. The recovery time constant circuit is connected to the input of amplifier 119 which is a voltage follower. Both of the amplifiers 118 and 119 may each be one-fourth of the type LM324 integrated amplifier circuit. Thus, each of amplifiers 111, 112, 118 and 119 may be on one integrated circuit chip. The output of amplifier 119 is proportional to $\overline{U}_i$. Thus, the circuitry thus far described in FIG. 3 constitutes the average value circuit 11 shown in FIG. 1.

The output of the voltage follower amplifier 119 is connected through a level adjusting potentiometer 120 to the input of logarithmic amplifier 121. The logarithmic amplifier 121 may be a type 755P integrated circuit manufactured by Analog Devices. The output of the logarithmic amplifier 121 is connected to a voltage divider network comprising a calibration potentiometer 131 and resistors 132, 133, 134 and 135 connected in series. The junctions between these resistors are connected to a multiposition switch 136. The output of the switch 136 determines the scale factor a and, therefore, selects the compression rate. The switch 136 is connected to one input of a low off-set inverter amplifier 137. The inverter amplifier 137 may be a type OP 07 integrated circuit amplifier manufactured by Precision Monolitics, Inc. The output of this inverter amplifier 137 is connected to the input of an anti-logarithmic amplifier 141. The anti-logarithmic amplifier 141 may also be a type 755P integrated circuit manufactured by Analog Devices. The different functions are obtained from the same type of circuit by changing terminal connections. The output of the anti-logarithmic amplifier 141 is connected to a voltage to current converter constituted by the amplifier 142 and its related circuitry. The amplifier 142 may be a second type of OP 07 integrated circuit amplifier manufactured by Precision Monolitics, Inc. It will now be appreciated that the circuit described thus far constitutes the logarithmic chain. It will also be understood that while the description of the circuit of FIG. 3 is in terms of the feedforward configuration of the compander, substantially the same logarithmic chain could be used in the feedback configuration.

The multiplier 10 in FIG. 1 is implemented by a variable transconductance amplifier 100. This amplifier receives as its inputs the input signal $u_i$ and the output of the voltage to current converter including the amplifier 142. The transconductance amplifier 100 may be type CA3080A integrated circuit operational amplifier manufactured by RCA. This operational transconductance amplifier has a differential input and a single-ended, class A output. In addition, the amplifier has an amplifier current bias input which is used in this circuit for linear gain control. The output current of the amplifier is equal or less than the bias current. As will be appreciated from the following discussion, the RCA type CA3080A operational transconductance amplifier performs quite well as the multiplier in the compander circuit. The desired dynamic range for the multiplier's syllabic input is given by $$\delta = \gamma(\alpha - 1)/\alpha \tag{4}$$

where $\gamma$ is the dynamic range of the compressor's input signal and $\alpha$ is the compression rate. $\delta$ as a function of $\alpha$, at $\gamma = 60$dB, is given in Table 2.

TABLE 2

| $\alpha$ | 2 | 3 | 4 |
|---|---|---|---|
| $\delta$ dB | 30 | 40 | 45 |

The desired dynamic range is the same for the expander multiplier syllabic input. The dynamic range of the bias current is, according to Table 2, 45 dB at a compression and expansion rate of 4. The selected bias current range for the RCA type CA3080A amplifier is in the range of 1μA to 200μA.

A high signal value is associated with a low transconductance value (low bias current) at the compressor, typically $g = 15 \cdot 10^{-6}$ mho at $J_{bias} = 1\mu A$. A 10 dBmO (2.45 V) signal, the highest signal level, must be attenuated with a factor K. Therefore, $$(2.45/K)\,15\cdot 10^{-6} = J_{out} = J_{bias} = 10^{-6}, \tag{5}$$

$$K = 15 \times 2.45 \times 10^{-6} = 37.$$

The −50dBm (2.45 V) signal attenuates to 66 μV. This explains the use of the differential input (common mode rejection) and the application of high output impedance.

Bias current change causes a non-negligible output current change, compared to the output AC current level. This is offset from the output of the anti-logrithmic amplifier through a Zener diode and a 20 KΩ resistor in series with the output impedance.

It should be mentioned finally that, according to measurements on 8 samples of transconductance amplifiers, the transconductance (g) is not exactly linear with the bias current. The transconductance versus bias current curve can be described better with equation (6).

$$g = K\,J_{bias}^{x} \tag{6}$$

where K is a constant and the exponent x is between 0.96 and 1.06. Therefore, the amplification factor of the scaling amplifier in the compressor should be chosen according to equation (7).

$$1 - \alpha'/\alpha' x = 1 - \alpha/\alpha \tag{7}$$

where $(1-\alpha)/\alpha$ is the amplification factor for a compression rate of $\alpha$ and an ideal transconductance amplifier. The amplification factor $(1-\alpha')/\alpha'$ ensures a compression rate of $\alpha$ with a transconductance amplifier according to equation (6). An analogous expression to equation (7) is equation (8) for the expander:

$$(1-\beta')x = 1-\beta \qquad (8)$$

Continuing with the description of the circuit shown in FIG. 3, the output of the transconductance amplifier 100 is connected to the input of amplifier 101. The amplifier 101 is an impedance converter, and the voltage divider 102 at its output ensures the same unaffected level for different compression rates. The amplifier 101 may be a type CA3130AT integrated circuit amplifier manufactured by RCA. The output of the voltage divider 102 is connected through a temperature compensation network including a thermistor 103 to the output amplifier 104. The temperature compensation network offsets the temperature dependence of the transconductance of amplifier 100. The output amplifier 101 may be one-half of a type $\mu$A747 integrated circuit amplifier manufactured by Fairchild Semiconductors. Thus, the integrated circuit amplifiers 150 and 104 may be implemented with a single integrated circuit chip.

The expander stage of the feedforward compander as illustrated in FIG. 4 is substantially the same as the compressor stage shown in FIG. 3. In fact, the precision 2-way rectifier of the expander is identical to that of the compressor. The attack time constant determined by the resistors 113 and 114 and the capacitor 115 is about 6ms. The amplitude setting for various expansion rates is set by the voltage divider 122 at the output of amplifier 119. The scaler amplifier 137 is non-inverting due to the positive exponent. Finally, because of the higher admissible signal amplitude to the linear transconductance amplifier 100, the output impedance is lower. Consequently, the impedance converter comprising the amplifier 101 and its related circuitry is not necessary.

Figure 5:
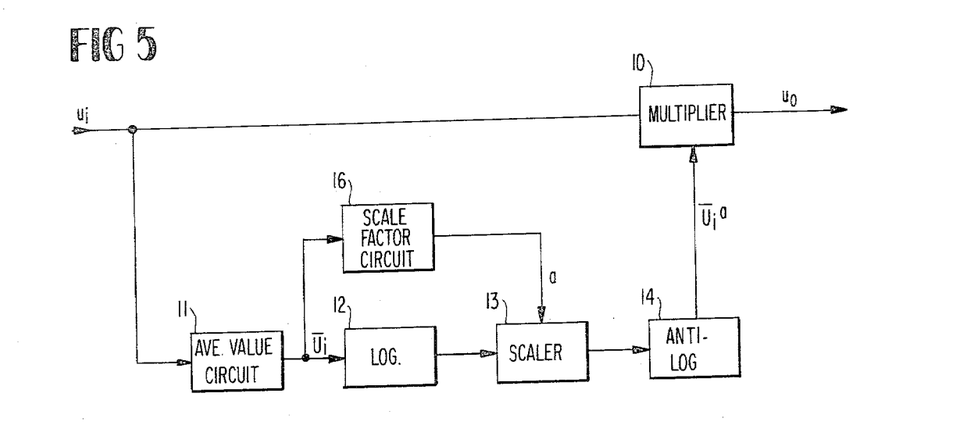
FIG. 5 is a block diagram showing a first modification of the basic feedforward compander shown in FIG. 1.
Figure 6:
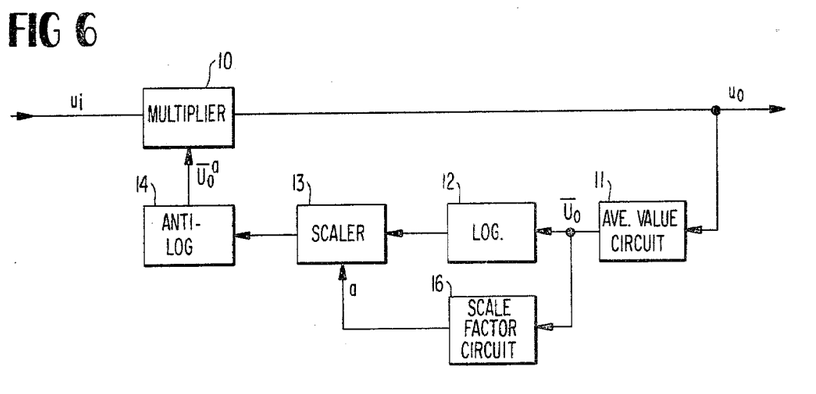
FIG. 6 is a block diagram showing a first modification of the basic feedback compander shown in FIG. 2.

Up to this point in the description of the invention, it has been assumed that the compression and expansion ratios, when selected, are constant and equal in the dynamic range of $u_i$ and $u_o$. This assures that the ratio of two input voltages at the input of the compressor is equal to the ratio of the associated output voltages at the output of the expander. If a transmission level change does not occur or is acceptable for a given application, the scaler can be set by $\overline{U}_i$ or $\overline{U}_o$, or a function of these two terms. In other words, a signal-level-dependent compression and expansion can be achieved and utilized, e.g., for additional subjective improvement in the signal-to-noise ratio. Such an arrangement is illustrated in FIGS. 5 and 6 for the respective configurations of the feedforward and the feedback companders. More specifically, the output of the average value circuit in addition to being connected to the logarithmic circuit 12 is also connected as an input to a scale factor circuit 16. The scale factor circuit 16 produces the scale factor a to the scaler 13. The scale factor circuit 16 may be designed to provide an output a which is any desired function of the input $\overline{U}_i$ or $\overline{U}_o$. For example, the scale factor circuit 16 may be an integrating circuit having a predetermined time constant.

Figure 7:
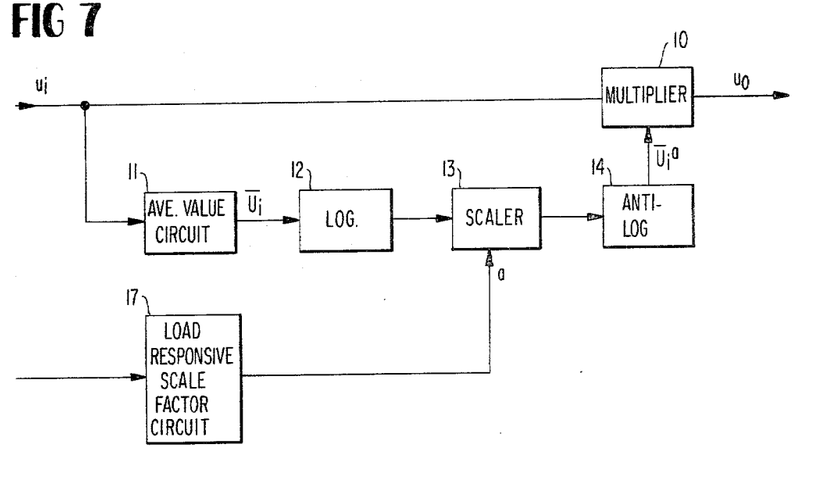
FIG. 7 is a block diagram showing a second modification of the basic feedforward compander shown in FIG. 1.
Figure 8:
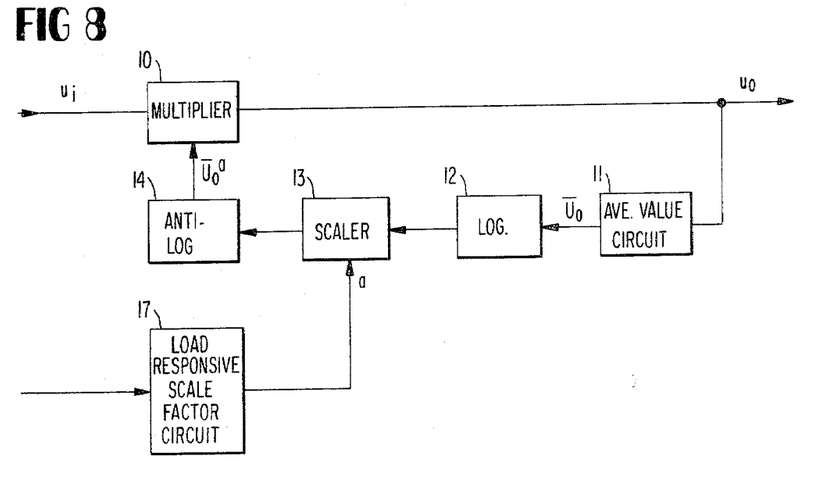
FIG. 8 is a block diagram of a second modification of the basic feedback compander shown in FIG. 2.

As previously mentioned, the insertion of a compressor in a telephone channel raises the level of the channel compared to the uncompandered level. The level in the compandered channel depends on the compression ratio and the unaffected level, i.e., the specific signal level which is unaffected by the compressor. In multichannel transmission over power limited wideband equipment, the equipment loading is dependent on a number of active channels and on the compression law. An adaptive system can be realized by changing the compression law of the companders as a function of common equipment load. Such an adaptive system is illustrated in FIGS. 7 and 8 for the cases of the feedforward and the feedback companders, respectively. In each case, a load responsive scale factor circuit 17 receives an input from the terminal equipment which is a functon of the number of active channels at any point in time. Based on this input, the scale factor a to the scaler 13 is varied. In its simplest form, the load responsive scale factor circuit provides an output scale factor signal with inverse relationship to the number of active channels.

The invention has been described in terms of preferred embodiments which employ analog signal processing. Those skilled in the art, however, will readily recognize that the advantages of the invention are not limited to analog signal processing. Each of the necessary operations performed by the various circuits represented by the blocks in the embodiment shown in FIGS. 1 and 2, for example, can also be performed digitally with the appropriate analog to digital and digital to analog conversions. A combination of analog and digital signal processing may also be used. For example, the multiplier 10 could be implemented as a digital logarithmic multiplier like that taught by Otakar A. Horna in U.S. Pat. No. 4,064,379. Other variations and modifications in the invention as disclosed will be apparent to those skilled in the art.

What is claimed is:

1. A compander for use in the transmission of speech over a communication channel including a compressor in the transmitter and an expander in the receiver, each of said compressor and said expander implementing equations of the general form $$u_o = K u_i \overline{U}^a$$

where $u_i$ is the input to the compressor or expander, $u_o$ is the output of the compressor or expander, $\overline{U}$ is an average value of $u_i$ or $u_o$ averaged over the time of one syllable, K is a constant, and a is a scale factor which is a function of the compression or expansion rate, each of said compressor and said expander comprising:

an average value means for generating signals proportional to said average value $\overline{U}$, a logarithmic chain connected to the output of said average value means and including logarithmic means for converting said signals proportional to said average value $\overline{U}$ to a signal proportional to the logarithm of said average value $\overline{U}$, scaler means connected to the output of said logarithmic means for multiplying said signal proportional to the logarithm of said average value $\overline{U}$ by a said scale factor a, an anti-logarithm means connected to the output of said scaler means for converting the output of said scaler means to a signal proportional to the anti-logarithm of the output thereof, said scale factor being adjustable to determine the compression or expansion rate of said compressor or expander, respectively, a multiplier means connected to receive as inputs a signal proportional to $u_i$ and the output of said logarithmic chain, said multiplier means producing an output proportional to $u_o$, and in each of said compressor and said expander, means responsive to said signals proportional to said average value $\overline{U}$ for adjusting said scale factor as a function of $\overline{U}$.

2. A compander for use in a multichannel communications system over a communication channel including a compressor in the transmitter and an expander in the receiver, each of said compressor and said expander impelementing equations of the general form $$u_o = K u_i \overline{U}^a$$

where $u_i$ is the input to the compressor or expander, $u_o$ is the output of the compressor or expander, $\overline{U}$ is an average value of $u_i$ or $u_o$ averaged over the time of one syllable, K is a constant, and a is a scale factor which is a function of the compression or expansion rate, each of said compressor and said expander comprising:

an average value means for generating signals proportional to said average $\overline{U}$, a logarithmic chain connected to the output of said average value means and including logarithmic means for converting said signals proportional to said average value $\overline{U}$ to a signal proportional to a logarithm of said average value $\overline{U}$, scaler means connected to the output of said logarithmic means for multiplying said signal proportional to the logarithm of said average value $\overline{U}$ by a said scale factor a, an anti-logarithm means connected to the output of said scaler means for converting the output of said scaler means to a signal proportional to the anti-logarithm of the output thereof, said scale factor being adjustable to determine the compression or expansion rate of said compressor or expander, respectively, a multiplier means connected to receive as inputs a signal proportional to $u_i$ and the output of said logarithmic chain, said multiplier means producing an output proportional to $u_o$, and in each of said compressor and said expander means responsive to the number of active channels in said communications systems for adjusting said scale factor a as a function of the number of active channels.

* * * * *

UNITED STATES PATENT AND TRADEMARK OFFICE
CERTIFICATE OF CORRECTION

PATENT NO. : 4,250,470
DATED : February 10, 1981
INVENTOR(S) : George G. Szarvas It is certified that error appears in the above—identified patent and that said Letters Patent is hereby corrected as shown below:

Column 1, line 18 - Delete "writted" insert --written--;

Column 2, line 39 - Delete "$U_i$" insert --$\overline{U}_i$-- line 40 - Delete "$K_1 = \omega_{i-}$" insert --$K_1 = \omega_{10}$-- line 41 - Delete "0" at beginning of line.

line 55 - Delete "$(\beta 1, \beta)$" insert --$\left(\frac{\beta-1}{\beta}\right)$--

Column 3, line 21 - After "input" delete "and" insert --the--

Signed and Sealed this

Second Day of June 1981

[SEAL]

Attest:

Attesting Officer

RENE D. TEGTMEYER

Acting Commissioner of Patents and Trademarks